United States Patent
Shirota et al.

(10) Patent No.: US 7,855,918 B2
(45) Date of Patent: Dec. 21, 2010

(54) METHOD FOR PROGRAMMING A MEMORY STRUCTURE

(75) Inventors: Riichiro Shirota, Hsinchu (TW); Ching-Hsiang Hsu, Hsin-Chu (TW); Cheng-Jye Liu, Taoyuan County (TW)

(73) Assignee: Powerflash Technology Corporation, Science Park, Hsinchu (TW)

( * ) Notice: Subject to any disclaimer, the term of this patent is extended or adjusted under 35 U.S.C. 154(b) by 345 days.

(21) Appl. No.: 12/144,645

(22) Filed: Jun. 24, 2008

(65) Prior Publication Data

US 2009/0168531 A1    Jul. 2, 2009

(30) Foreign Application Priority Data

Dec. 31, 2007   (TW) .............................. 96151629 A

(51) Int. Cl.
*G11C 16/04*   (2006.01)
(52) U.S. Cl. ............................ 365/185.18; 365/185.13; 365/185.14; 365/185.15; 365/185.26
(58) Field of Classification Search ............ 365/185.13, 365/185.14, 185.15, 185.18, 185.26
See application file for complete search history.

(56) References Cited

U.S. PATENT DOCUMENTS

| | | | |
|---|---|---|---|
| 7,196,930 B2 * | 3/2007 | Han et al. ............... | 365/185.18 |
| 7,460,404 B1 * | 12/2008 | Dong et al. ............ | 365/185.17 |
| 2006/0227613 A1 * | 10/2006 | Joo ........................ | 365/185.18 |

* cited by examiner

*Primary Examiner*—Pho M Luu
*Assistant Examiner*—Tha-o Bui
(74) *Attorney, Agent, or Firm*—Winston Hsu; Scott Margo

(57) ABSTRACT

A memory structure includes a first memory cell and a second memory cell located at an identical bit line and adjacent to the first memory cell. Each memory cell includes a substrate, a source, a drain, a charge storage device, and a gate. A method for programming the memory structure includes respectively providing a first gate biasing voltage and a second gate biasing voltage to the first memory cell and the second memory cell, boosting the absolute value of a channel voltage of the first memory cell to generate electron and hole pairs at the drain of the second memory cell through gate-induced drain leakage or band-to-band tunneling, and injecting the electron of the generated electron and hole pairs into the charge storage device of the first memory cell to program the first memory cell.

12 Claims, 11 Drawing Sheets

| Biasing Voltage | Setting Value |
| --- | --- |
| $V_{GB1}$ | 15V ($V_{GB1} > V_{GB3}$; $V_{GB1} > V_{GB4}$) |
| $V_{GB2}$ | 0V (or < 0V) |
| $V_{GB3}$ | 8V |
| $V_{GB4}$ | 8V |
| $V_{BL}$ | 3V |
| $V_{SGD}$ | 3V |
| $V_{SGS}$ | 0V |
| $V_{SL}$ | 2V |
| $V_{SUB}$ | 0V |

FIG. 3

| Biasing Voltage | Setting Value |
| --- | --- |
| $V_{GB1}$ | -15V ($|V_{GB1}|>|V_{GB3}|$; $|V_{GB1}|>|V_{GB4}|$) |
| $V_{GB2}$ | 0V ( or> 0V) |
| $V_{GB3}$ | -8V |
| $V_{GB4}$ | -8V |
| $V_{BL}$ | -3V |
| $V_{SGD}$ | -3V |
| $V_{SGS}$ | 0V |
| $V_{SL}$ | -2V |
| $V_{SUB}$ | 0V |

FIG. 8

|  | Method for programming a memory structure in the prior art | Method for programming a memory structure disclosed in the present invention |
|---|---|---|
| Programming Voltage | 26V | 10V ~ 15V |
| Disturbance Immunity for Programming Data | Common Disturbance Immunity | Improved Disturbance Immunity |
| Electron Injection Mode | Tunneling Effect | GIDL or BTBT effect |

FIG. 11

METHOD FOR PROGRAMMING A MEMORY STRUCTURE

BACKGROUND OF THE INVENTION

1. Field of the Invention

The present invention relates to a method for programming a memory structure, and more particularly, to a method for programming a memory cell by injecting an electron or a hole generated by gate-induced drain leakage (GIDL) or band-to-band tunneling (BTBT) effects at adjacent memory cells.

2. Description of the Prior Art

A semiconductor memory can be divided into two categories: dynamic random access memory (DRAM) and non-volatile memory. The difference between these categories is whether the stored data can be reserved for a long time when external electric power is turned off. The data stored in the DRAM will disappear but the data stored in the non-volatile memory will be preserved. Currently, flash memory is a mainstream non-volatile memory, which can be further divided into NOR flash and NAND flash. The NAND flash has the advantages of high capacity, faster programming speed, and smaller device area.

When performing programming operations, the flash memory disposes electrons in a floating gate. When performing erasing operations, the flash memory moves the electrons from the floating gate. At present, there are two major methods of disposing the elections in the floating gate. In the first method, the electrons inside the channels are sped up by a depletion region for obtaining enough energy to stride across an oxide layer energy barrier by injecting channel hot carriers, thus the electrons are injected into the floating gate. In the second method, a voltage for generating the Fowler-Nordheim tunneling effect is added between the control gate and the substrate, thus the electrons are moved from the substrate to the floating gate through the oxide layer. These two methods respectively have their advantages and disadvantages. By adopting the method of injecting the channel hot carriers, elements need not operate under a very high voltage but a larger power consumption is needed when programming data. On the other hand, by adopting the method of injecting electrons through the tunneling effect, a lower power consumption is needed but a sufficient electronic field is necessary for the oxide layer to induce the tunneling effect on the electrons. Therefore, high voltage operations cannot be avoided, which are usually between 20V-30V. Hence, how to improve efficiency for erasing/programming a memory, how to lower operation voltage and power consumption, and how to improve disturbance immunity are important topics to be considered when designing a memory.

SUMMARY OF THE INVENTION

It is one of the objectives of the present invention to provide a method for programming a memory structure by injecting hot carriers generated from gate-induced drain leakage or band-to-band tunneling to program a memory cell for solving the abovementioned problems.

The present invention provides a method for programming a memory structure. The memory structure includes a plurality of memory cells where each memory cell has a substrate, a source located on the substrate, a drain located on the substrate, a charge storage device located between the source and the drain, and a gate located on the charge storage device and between the source and the drain. The plurality of memory cells includes a first memory cell and a second memory cell located on an identical bit line adjacent to the first memory cell. The method includes providing a first gate biasing voltage and a second gate biasing voltage to the gates of the first memory cell and the second memory cell, respectively; boosting an absolute value of a channel voltage of the first memory cell to generate electron and hole pairs at the drain of the second memory cell through gate-induced drain leakage or band-to-band tunneling, wherein the first gate biasing voltage is greater than the channel voltage of the first memory cell, and the channel voltage of the first memory cell is greater than the second gate biasing voltage; and injecting the electron of the generated electron and hole pairs into the charge storage device of the first memory cell to program the first memory cell. The substrate is a P-type substrate.

The present invention further provides a method for programming a memory structure. The memory structure includes a plurality of memory cells where each memory cell has a substrate, a source located on the substrate, a drain located on the substrate, a charge storage device located between the source and the drain, and a gate located on the charge storage device and between the source and the drain. The plurality of memory cells includes a first memory cell and a second memory cell located on an identical bit line adjacent to the first memory cell. The method includes providing a first gate biasing voltage and a second gate biasing voltage to the gates of the first memory cell and the second memory cell, respectively; boosting an absolute value of a channel voltage of the first memory cell to generate electron and hole pairs at the drain of the second memory cell through gate-induced drain leakage or band-to-band tunneling, wherein the first gate biasing voltage is lower than the channel voltage of the first memory cell, and the channel voltage of the first memory cell is lower than the second gate biasing voltage; and injecting the hole of the generated electron and hole pairs into the charge storage device of the first memory cell to program the first memory cell. The substrate is an N-type substrate.

In one embodiment, the charge storage device is a floating gate device or a charge trapping layer device.

In one embodiment, the memory structure is a non-volatile memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram of a table showing settings of each biasing voltage shown in FIG. 2.

FIG. 8 is a diagram of a table showing settings of each biasing voltage shown in FIG. 7.

FIG. 11 is a diagram of a table showing comparisons between the method for programming a memory structure disclosed in the present invention and the method for programming a memory structure in the prior art.

DETAILED DESCRIPTION

Figure 1:
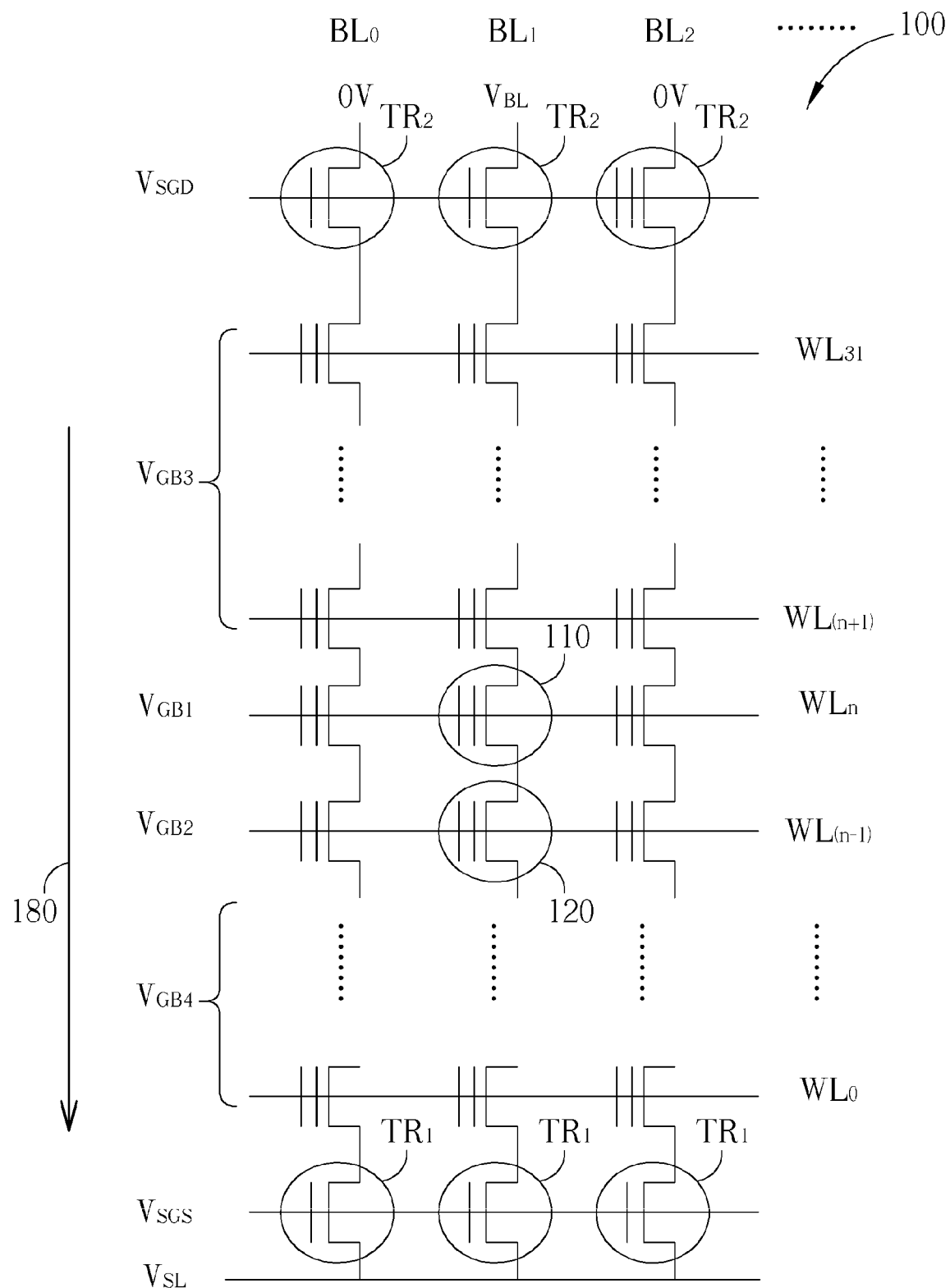
FIG. 1 is a diagram illustrating how to program a memory structure according to an embodiment of the present invention.

Please refer to FIG. 1. FIG. 1 is a diagram illustrating how to program a memory structure 100 according to an embodiment of the present invention. In this embodiment, the memory structure 100 is a NAND flash including a plurality of memory cells arranged in an array, wherein each column, labeled by $WL_0$-$WL_{31}$, represents a word line (WL) and each row, labeled by $BL_0$-$BL_2$, represents a bit line (BL). The gates of the memory cells located on the same word line are coupled to an identical gate biasing voltage, and the memory cells located on the same bit line are coupled to each other in series. In addition, each of the bit lines has a first transistor $TR_1$ and a second transistor $TR_2$, which are respectively located at the beginning terminal and the end terminal of the bit line and are respectively controlled to be turned on and off by biasing voltages $V_{SGS}$ and $V_{SGD}$.

Figure 2:
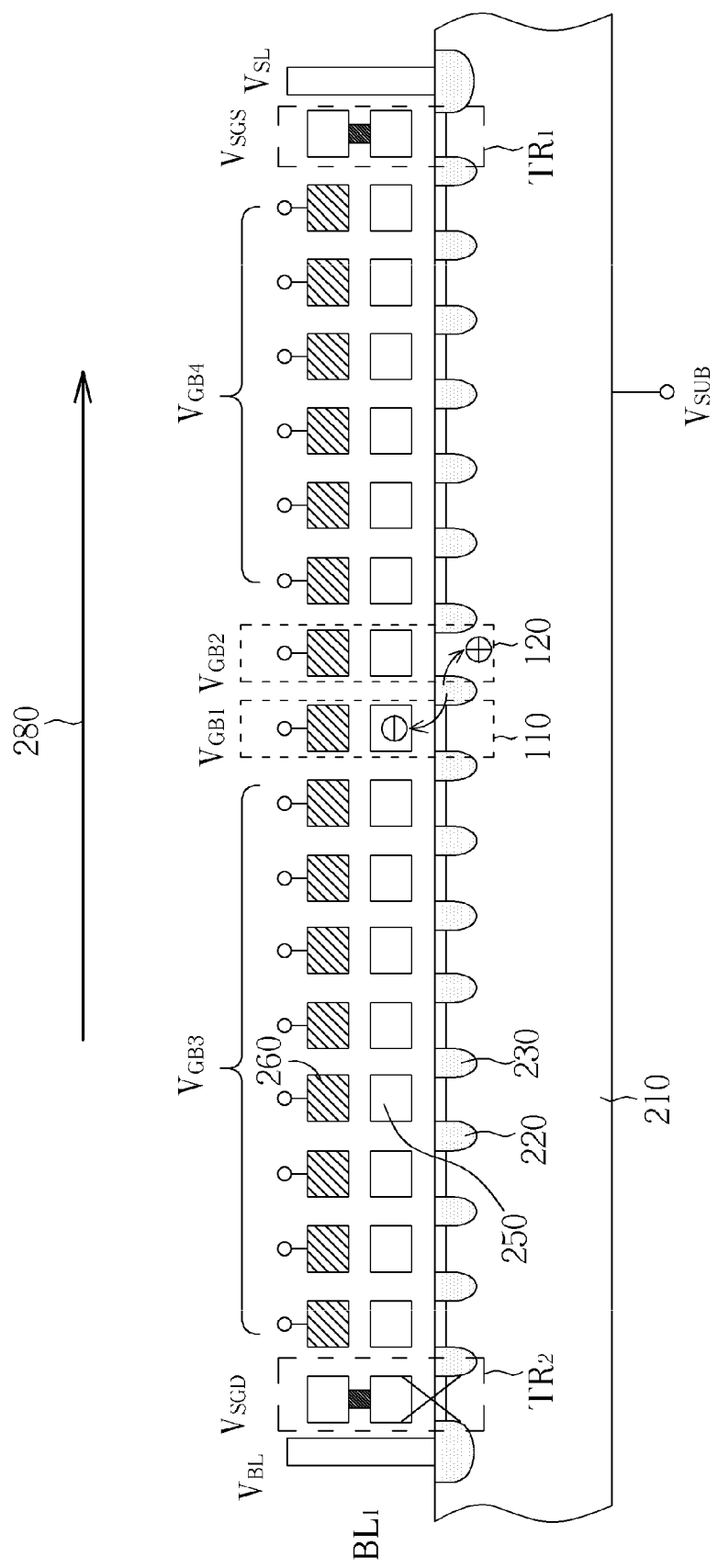
FIG. 2 is a diagram of the bit line where the memory cell to be programmed shown in FIG. 1 locates according to a first embodiment of the present invention.

Assume that a user desires to program a memory cell 110, and a programming sequence proceeds according to the direction indicated by an arrow 180 shown in FIG. 1. Thus, a biasing voltage $V_{BL}$ is added to the bit line $BL_1$ where the memory cell 110 locates, and a biasing voltage of 0V is given to the other unselected bit lines, wherein the absolute value of the biasing voltage $V_{BL}$ is greater than 0V. Furthermore, a first gate biasing voltage $V_{GB1}$ is added to the word line $WL_n$ where the memory cell 110 locates, a second gate biasing voltage $V_{GB2}$ is added to the word line $WL_{(n-1)}$, i.e., the word line where a memory cell 120 adjacent to the memory cell 110 locates, a third gate biasing voltage $V_{GB3}$ is added to the word lines $WL_{(n+1)}$-$WL_{31}$, and a fourth gate biasing voltage $V_{GB4}$ is added to the word line $WL_0$-$WL_{(n-2)}$. The absolute value of the first gate biasing voltage $V_{GB1}$ is greater than the absolute value of the third gate biasing voltage $V_{GB3}$, i.e., $|V_{GB1}|>|V_{GB3}|$. The absolute value of the first gate biasing voltage $V_{GB1}$ is greater than the absolute value of the fourth gate biasing voltage $V_{GB4}$, i.e., $|V_{GB1}|>|V_{GB4}|$. The second gate biasing voltage $V_{GB2}$ is approximately 0V. The operations of each memory cell of the memory structure 100 and the settings of each biasing voltage under programming operations are further detailed in the following embodiments Please refer to FIG. 2. FIG. 2 is a diagram of the bit line $BL_1$ where the memory cell 110 to be programmed shown in FIG. 1 locates according to a first embodiment of the present invention. The direction indicated by an arrow 280 shown in FIG. 2 is the same as that indicated by the arrow 180 shown in FIG. 1, and identical elements and identical biasing voltages are represented by the same symbols shown in FIG. 1 The bit line $BL_1$ includes 32 memory cells in total (FIG. 2 does not show all 32 memory cells, however, for simplicity). Each memory cell has a substrate 210, a source 220 located on the substrate 210, a drain 230 located on the substrate 210, a charge storage device 250, and a gate 260 located on the charge storage device 250 and between the source 220 and the drain 230.

In the abovementioned embodiment, the substrate 210 is a P-type substrate. Please also refer to FIG. 3 for the settings of each biasing voltage shown in FIG. 2. For example, the first gate biasing voltage $V_{GB1}$ added to the memory cell 110 is a positive value (such as 15V), the second gate biasing voltage $V_{GB2}$ added to the memory cell 120 is 0V (or smaller than 0V), the third gate biasing voltage $V_{GB3}$ and the fourth gate biasing voltage $V_{GB4}$ are both positive values and smaller than the first gate biasing voltage $V_{GB1}$ (such as $V_{GB3}$=8V and $V_{GB4}$=8V), the biasing voltage $V_{BL}$ is a positive value (such as 3V), the biasing voltage $V_{SGD}$ is a positive value (such as 3V), the biasing voltage $V_{SGS}$ is approximately 0V, the biasing voltage $V_{SL}$ is a positive value (such as 2V), and the biasing voltage $V_{SUB}$ added to the substrate 210 is 0V.

In the following description, the settings of each biasing voltage shown in FIG. 3 are used for illustrating the operations of each memory cell shown in FIG. 2. Because the voltage level of the biasing voltage $V_{SGD}$ is the same as the biasing voltage $B_{BL}$ and the first transistor $TR_1$ is turned off, the second transistor $TR_2$ is turned off also. At this time, the channel voltage of all the memory cells located at the left side of the memory cell 110 is boosted, i.e., the memory cells added by the third gate biasing voltage $V_{GB3}$ and the memory cell 110. In addition, the channel voltage of all the memory cells located at the right side of the memory cell 120 is also boosted, i.e., the memory cells added by the fourth gate biasing voltage $V_{GB4}$. Because the channel voltages at both sides of the memory cell 120 are boosted and the second gate biasing voltage $V_{GB2}$ is 0V, the memory cell 120 is turned off. At this time, a voltage difference between the gate voltage of the memory cell 120 and the junction voltage is large enough (a negative value), therefore, sufficient electron and hole pairs (e−/h+ pair) will be generated at the drain of the memory cell 120, which is called gate-induced drain leakage or band-to-band tunneling effect. Due to the first gate biasing voltage $V_{GB1}$ being very large (such as 15V), the electron of the generated electron and hole pairs can be injected into the charge storage device 250 of the memory cell 110 to program the memory cell 110.

Please note that the channel voltage of the memory cells located at the left side of the memory cell 110 is boosted for the sake of generating sufficient electron and hole pairs, but the channel voltage of the memory cells located at the right side of the memory cell 120 is boosted for the sake of turning off the memory cell 120, and the operations of boosting the two channel voltages therefore have different objectives from each other.

Figure 4:
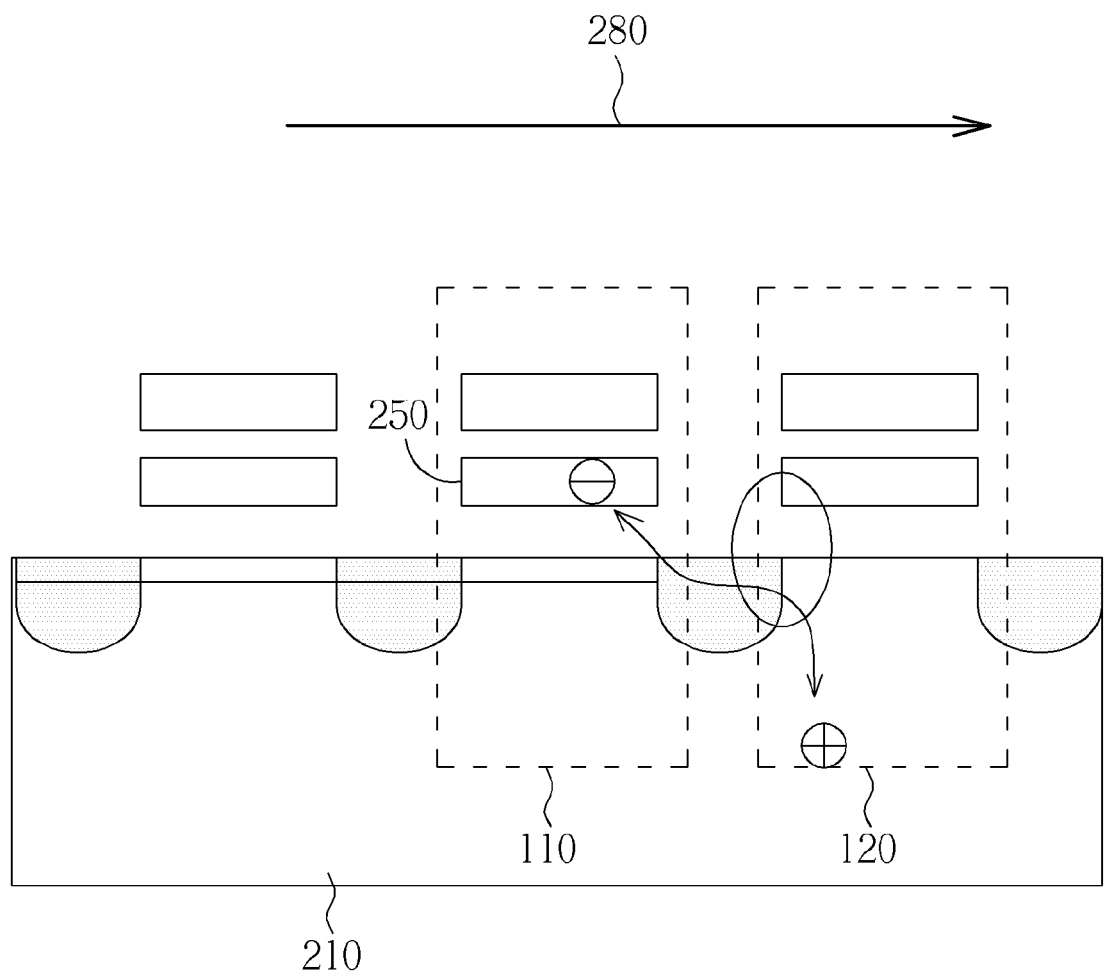
FIG. 4 is a partial amplified diagram of FIG. 2.

Please refer to FIG. 4, which is a partial amplified diagram of FIG. 2. As can be seen from FIG. 4, there are sufficient electron and hole pairs generated between the memory cell 110 and the memory cell 120, i.e., the GIDL phenomenon. Due to the first gate biasing voltage $V_{GB1}$ that is added to the memory cell 110 being very large, the electron of the generated electron and hole pairs can be injected into the charge storage device 250 of the memory cell 110 to program the memory cell 110.

Figure 5:
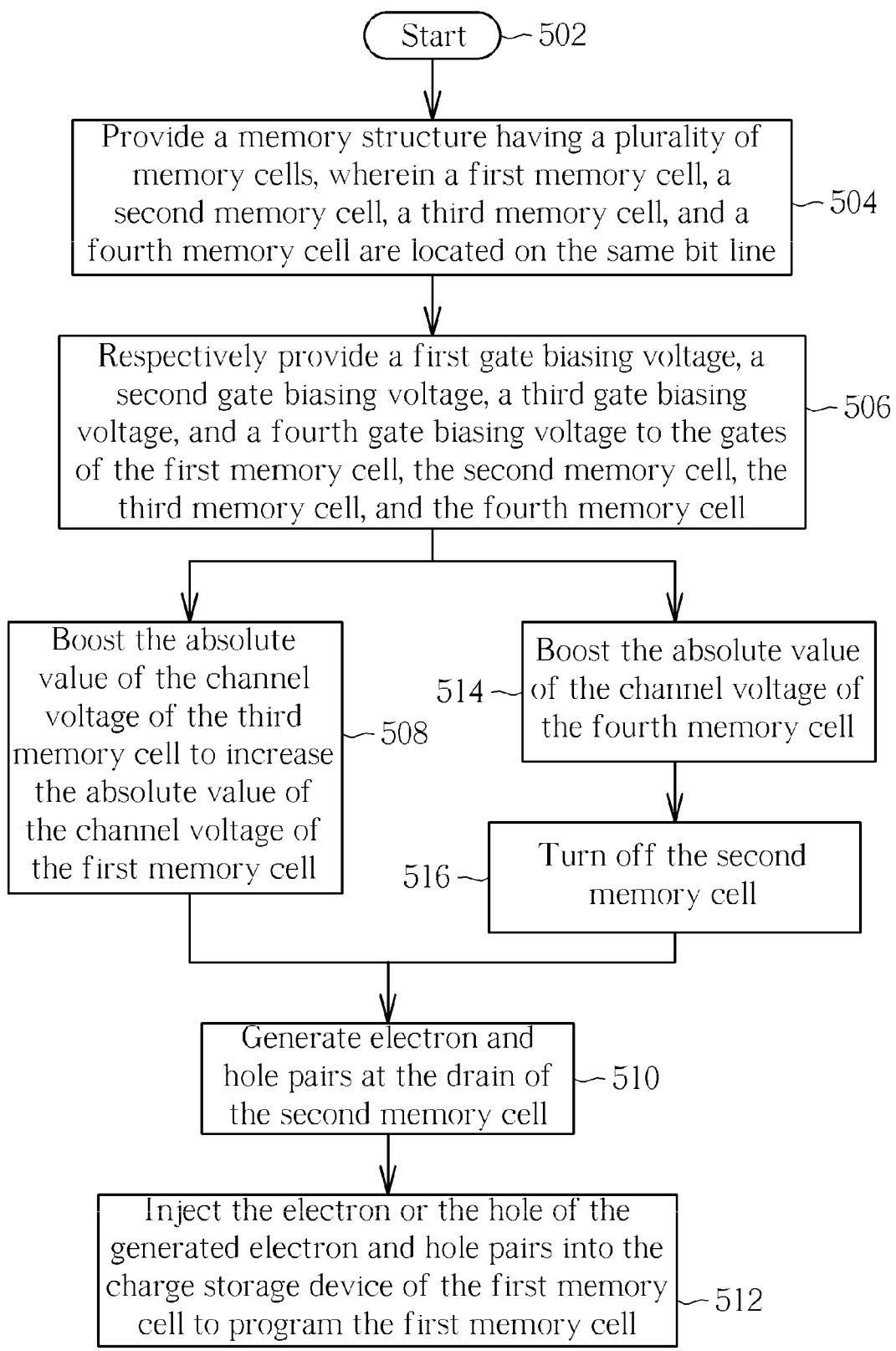
FIG. 5 is a flowchart illustrating a method for programming a memory structure according to an exemplary embodiment of the present invention.

FIG. 5 is a flowchart illustrating a method for programming a memory structure according to an exemplary embodiment of the present invention. Please note that the following steps are not limited to be performed according to the exact sequence shown in FIG. 5 if a roughly identical result can be obtained. The method includes the following steps:

Step 502: Start.

Step 504: Provide a memory structure having a plurality of memory cells, wherein a first memory cell, a second memory cell, a third memory cell, and a fourth memory cell are located on the same bit line, the first memory cell is located adjacent to the second memory cell, the first memory cell is located between the second memory cell and the third memory cell, and the second memory cell is located between the first memory cell and the fourth memory cell.

Step 506: Respectively provide a first gate biasing voltage, a second gate biasing voltage, a third gate biasing voltage, and a fourth gate biasing voltage to the gates of the first memory cell, the second memory cell, the third memory cell, and the fourth memory cell.

Step 508: Boost the absolute value of the channel voltage of the third memory cell to increase the absolute value of the channel voltage of the first memory cell.

Step 510: Generate electron and hole pairs at the drain of the second memory cell.

Step 512: Inject the electron or the hole of the generated electron and hole pairs into the charge storage device of the first memory cell to program the first memory cell.

Step 514: Boost the absolute value of the channel voltage of the fourth memory cell.

Step 516: Turn off the second memory cell.

In the following description, how each element operates is described by collocating the steps shown in FIG. 5, the elements shown in FIG. 2, and the settings of each biasing voltage shown in FIG. 3. In the steps 504-506, locations of the first memory cell, the second memory cell, the third memory cell, and the fourth memory cell are shown in FIG. 2, wherein the memory cell 110 represents the first memory cell and the memory cell 120 represents the second memory cell. In addition, the first gate biasing voltage, the second gate biasing voltage, the third gate biasing voltage, and the fourth gate biasing voltage are respectively represented by $V_{GB1}$, $V_{GB2}$, $V_{GB3}$, and $V_{GB4}$ shown in FIG. 2. In Step 508, the absolute value of the channel voltage of the third memory cell is boosted by the third gate biasing voltage $V_{GB3}$ to increase the absolute value of the channel voltage of the first memory cell (i.e., the memory cell 110). Furthermore, the absolute value of the channel voltage of the fourth memory cell is boosted by the fourth gate biasing voltage $V_{GB4}$ to turn off the memory cell 120 (the Steps 514-516). Therefore, sufficient electron and hole pairs are generated at the drain of the second memory cell through GIDL or BTBT effect (Step 510). Due to the first gate biasing voltage $V_{GB1}$ being large enough, the electron or hole of the generated electron and hole pairs can be injected into the charge storage device 250 of the memory cell 110 to program the memory cell 110 (Step 512).

Please note that the abovementioned steps are merely a practical embodiment of the present invention, and in no way should be considered to be limitations of the scope of the present invention. Provided that substantially the same result is achieved, the steps of the method shown in FIG. 5 need not be in the exact order shown and need not be contiguous, that is, other steps can be intermediate.

Figure 6:
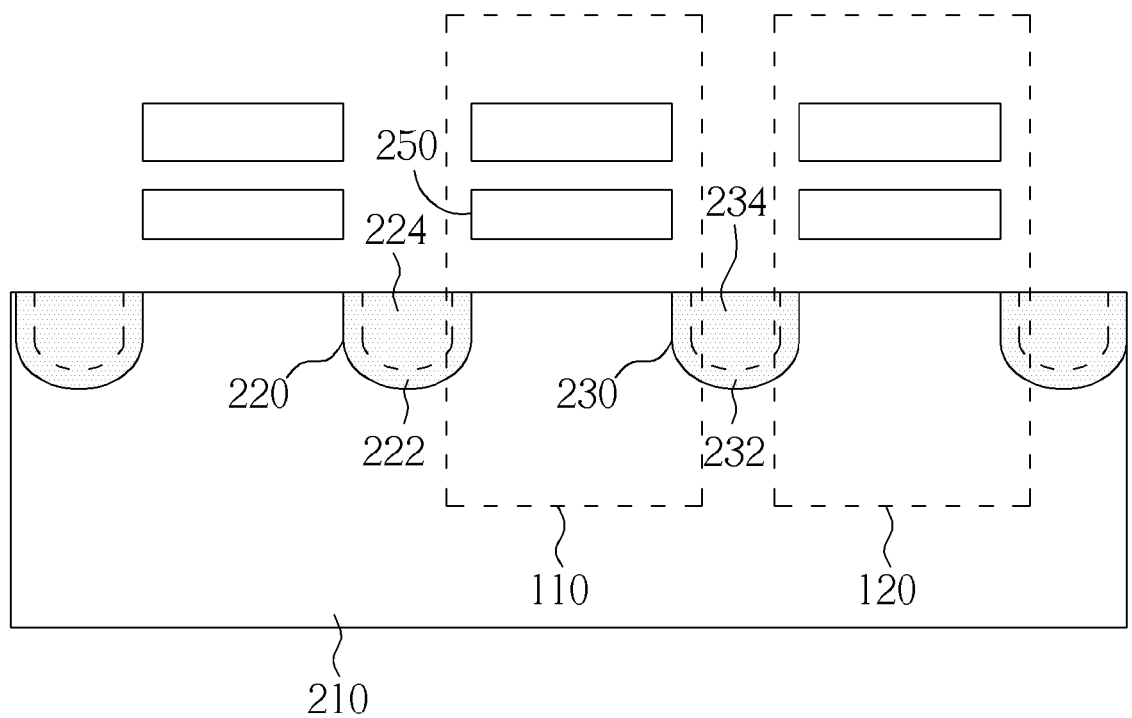
FIG. 6 is a diagram showing distributions of a concentration of the source and the drain of the memory cells shown in FIG. 2.

Please refer to FIG. 6. FIG. 6 is a diagram showing distributions of a concentration of the source and the drain of the memory cells shown in FIG. 2. Because the substrate 210 is a P-type substrate in this embodiment, the source 220 and the drain 230 of each memory cell are N-type. In order to generate sufficient electron and hole pairs at the drain of the memory cell 120 more easily, the N-type concentration of the source 220 and the drain 230 closer to the substrate 210 (labeled by first parts 222 and 232 in FIG. 6) is denser. Furthermore, in order to move the electron to the charge storage device 250 more easily, the N-type concentration of the source 220 and the drain 230 closer to the charge storage device 250 (labeled by second parts 224 and 234 in FIG. 6) is lighter. In other words, the N-type concentration of the first parts 222 and 232 of the source 220 and the drain 230 is denser than the N-type concentration of the second parts 224 and 234.

Figure 7:
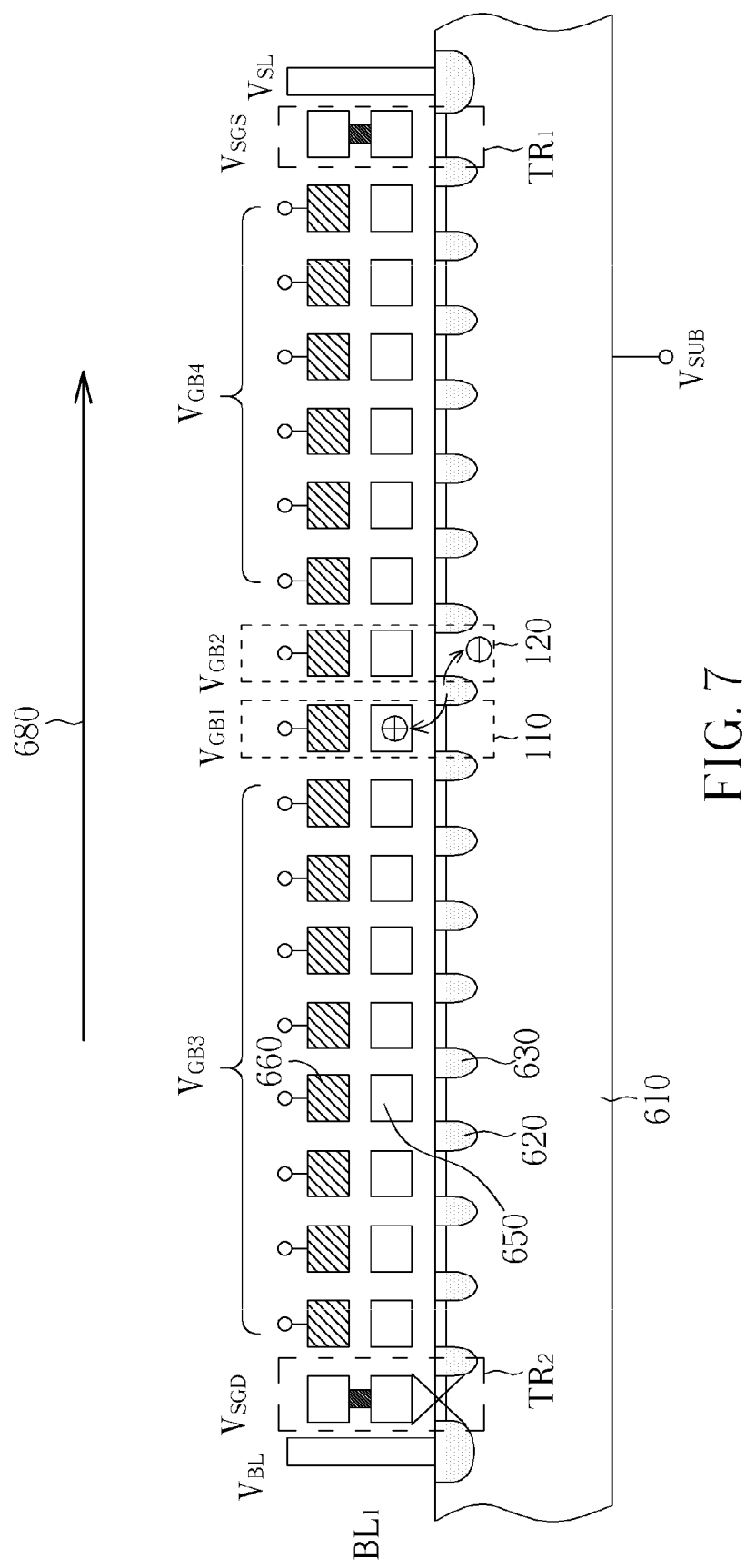
FIG. 7 is a diagram of the bit line where the memory cell to be programmed shown in FIG. 1 locates according to a second embodiment of the present invention.

Please refer to FIG. 7. FIG. 7 is a diagram of the bit line $BL_1$ where the memory cell 110 to be programmed shown in FIG. 1 locates according to a second embodiment of the present invention. The direction indicated by an arrow 680 shown in FIG. 7 is the same as that indicated by the arrow 180 shown in FIG. 1, and identical elements and identical biasing voltages are represented by the same symbols shown in FIG. 1. The bit line $BL_1$ includes 32 memory cells in total (in FIG. 7, however, not all 32 memory cells are shown in the diagram for simplicity). Each memory cell has a substrate 610, a source 620 located on the substrate 610, a drain 630 located on the substrate 610, a charge storage device 650, and a gate 660 located on the charge storage device 650 and between the source 220 and the drain 630.

In the abovementioned embodiment, the substrate 610 is an N-type substrate. Please also refer to FIG. 8 for the settings of each biasing voltage shown in FIG. 7. For example, the first gate biasing voltage $V_{GB1}$ added to the memory cell 110 is a negative value (such as −15V), the second gate biasing voltage $V_{GB2}$ added to the memory cell 120 is 0V (or greater than 0V), the third gate biasing voltage $V_{GB3}$ and the fourth gate biasing voltage $V_{GB4}$ are both negative values and smaller than the absolute value of the first gate biasing voltage $V_{GB1}$ (such as $V_{GB3}$=−8V and $V_{GB4}$=−8V), the biasing voltage $V_{BL}$ is a negative value (such as −3V), the biasing voltage $V_{SGD}$ is a negative value (such as −3V), the biasing voltage $V_{SGS}$ is approximately 0V, the biasing voltage $V_{SL}$ is a negative value (such as −2V), and the biasing voltage $V_{SUB}$ added to the substrate 610 is 0V.

In the following description, the settings of each biasing voltage shown in FIG. 8 are used for illustrating the operations of each memory cell shown in FIG. 7. Because the voltage level of the biasing voltage $V_{SGD}$ is the same as the biasing voltage $B_{BL}$ and the first transistor $TR_1$ is turned off, the second transistor $TR_2$ is turned off also. At this time, the absolute value of the channel voltage of all the memory cells located at the left side of the memory cell 110 is boosted, i.e., the memory cells added by the third gate biasing voltage $V_{GB3}$ and the memory cell 110. In addition, the absolute value of the channel voltage of all the memory cells located at the right side of the memory cell 120 is also boosted, i.e., the memory cells added by the fourth gate biasing voltage $V_{GB4}$. Because the absolute value of the channel voltages at both sides of the memory cell 120 are boosted and the second gate biasing voltage $V_{GB2}$ is 0V, the memory cell 120 is turned off. At this time, a voltage difference between the gate voltage of the memory cell 120 and the junction voltage is large enough (a positive value), therefore, sufficient electron and hole pairs (e−/h+ pair) will be generated at the drain of the memory cell 120, which is called gate-induced drain leakage or band-to-band tunneling effect. Due to the absolute value of the first gate biasing voltage $V_{GB1}$ being very large (such as −15V), the hole of the generated electron and hole pairs can be injected into the charge storage device 650 of the memory cell 110 to program the memory cell 110.

Please note that the absolute value of the channel voltage of the memory cells located at the left side of the memory cell 110 is boosted for the sake of generating sufficient electron and hole pairs, but the absolute value of the channel voltage of the memory cells located at the right side of the memory cell 120 is boosted for the sake of turning off the memory cell 120, and the operations of boosting the two channel voltages therefore have different objectives from each other.

Figure 9:
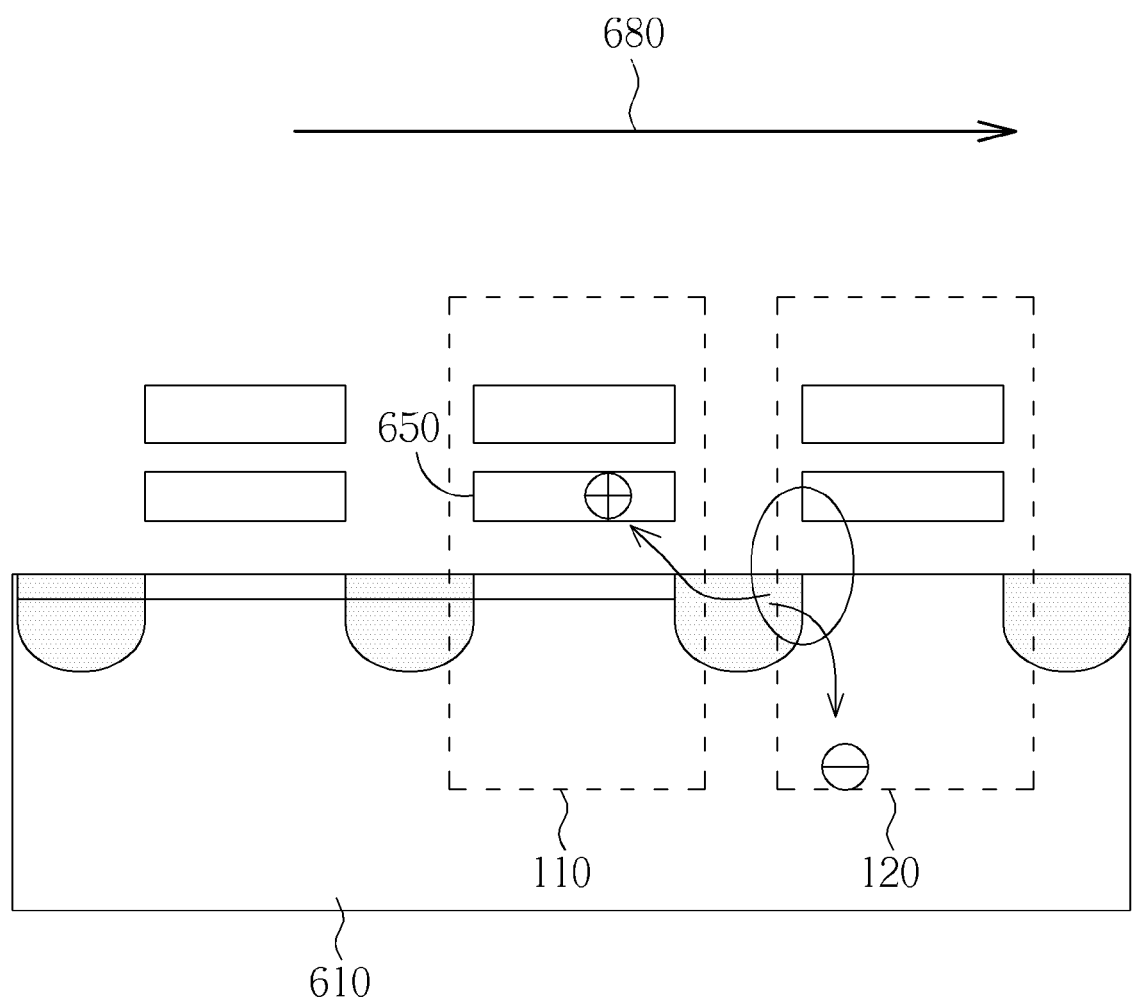
FIG. 9 is a partial amplified diagram of FIG. 7.

Please refer to FIG. 9, which is a partial amplified diagram of FIG. 7. As can be seen from FIG. 7, there are sufficient electron and hole pairs generated between the memory cell 110 and the memory cell 120, i.e., the GIDL phenomenon. Due to the absolute value of the first gate biasing voltage $V_{GB1}$ added to the memory cell 110 being very large, the hole of the generated electron and hole pairs can be injected into the charge storage device 650 of the memory cell 110 to program the memory cell 110.

Figure 10:
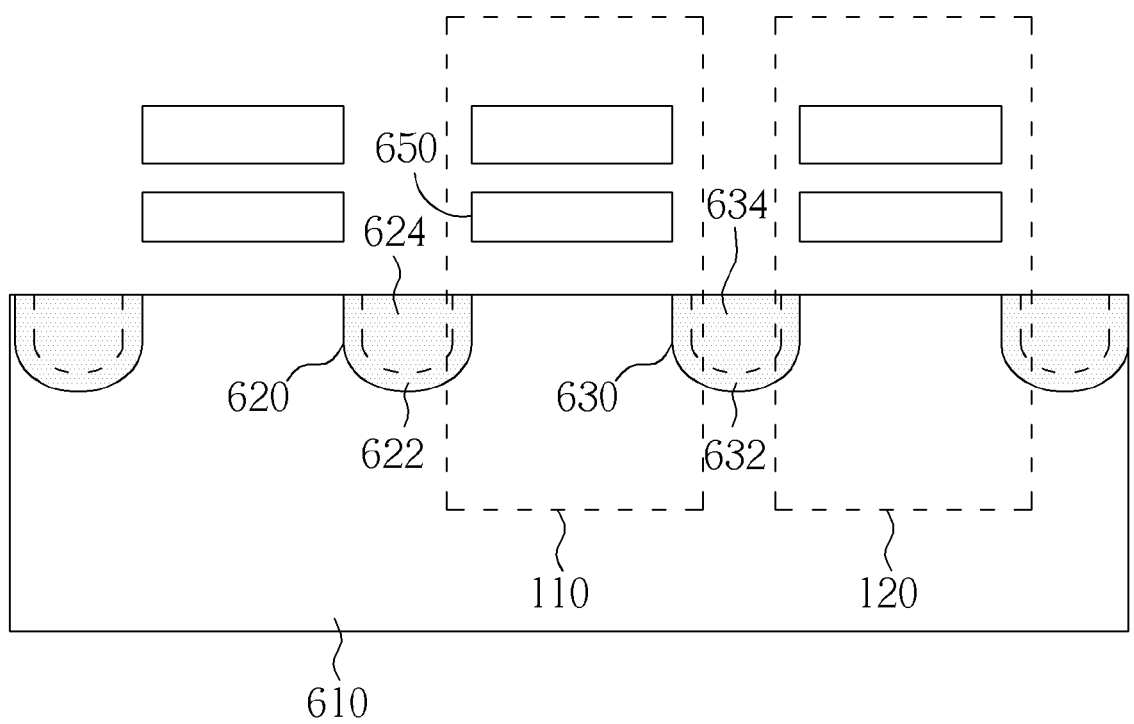
FIG. 10 is a diagram showing distributions of a concentration of the source and the drain of the memory cells shown in FIG. 7.

Please refer to FIG. 10. FIG. 10 is a diagram showing distributions of a concentration of the source and the drain of the memory cells shown in FIG. 7. Because the substrate 610 is an N-type substrate in this embodiment, the source 620 and the drain 630 of each memory cell are P-type. In order to generate sufficient electron and hole pairs at the drain of the memory cell 120 more easily, the P-type concentration of the source 620 and the drain 630 closer to the substrate 610 (labeled by first parts 622 and 632 in FIG. 10) is denser. Furthermore, in order to move the electron to the charge storage device 650 more easily, the P-type concentration of the source 620 and the drain 630 closer to the charge storage device 650 (labeled by second parts 624 and 634 in FIG. 10) is lighter. In other words, the P-type concentration of the first parts 622 and 632 of the source 620 and the drain 630 is denser than the P-type concentration of the second parts 624 and 634.

Please note that, in the embodiments above, the settings of each biasing voltage are presented merely for describing applications of the present invention, and in no way should be considered to be limitations of the scope of the present invention. The abovementioned charge storage devices 250 and 650 can be implemented by a floating gate device or a charge trapping device, and the charge storage devices 250 and 650 are capable of storing one bit or two bits. In addition, the memory structure 100 can be a non-volatile memory, such as a NAND flash, a multi-time programmable memory (MTP), or a one-time programmable memory (OTP), but these modifications should also not be taken as limitations of the present invention. Those skilled in the art should readily know that the method for programming a memory structure disclosed in the present invention could also be applied to memory structures of other types. In the first embodiment, the method for programming a memory structure disclosed in the present invention is applied to an N-type channel, which injects the electron of the electron and hole pairs generated from the positive first gate biasing voltage $V_{GB1}$ into the charge storage device 250 of the memory cell 110. In the second embodiment, the method for programming a memory structure disclosed in the present invention is applied to a P-type channel, which injects the hole of the electron and hole pairs generated from the negative first gate biasing voltage $V_{GB1}$ into the charge storage device 650 of the memory cell 110. Furthermore, the programming sequence can proceed according to the directions indicated by the arrows 180, 280, or 680, which also belongs to the scope of the present invention.

Please refer to FIG. 11. FIG. 11 is a diagram of a table showing comparisons between the method for programming a memory structure disclosed in the present invention and the method for programming a memory structure in the prior art. As shown in FIG. 11, if a tunneling effect is adopted for injecting electrons utilizing the method for programming a memory structure according to the prior art, a very large programming voltage (such as 26V) is necessary and it has a common disturbance immunity. On the other hand, GIDL or BTBT effect is adopted for programming data by the method for programming a memory structure disclosed in the present invention, thus only a programming voltage with 10V or 15V is necessary. Such an effect only appears on the bit line ($BL_1$) where the memory cell 110 to be programmed locates and will not appear on other bit lines where adjacent memory cells locate, and therefore disturbance immunity for programming data can be improved. Furthermore, when programming operations are performed by the method disclosed in the present invention, the two transistors $TR_1$ and $TR_2$ located at the two terminals of the bit line $BL_1$ are both turned off. This feature is different from the method disclosed in the prior art, which only has one transistor being turned off.

The abovementioned embodiments are presented merely for describing the present invention, and in no way should be considered to be limitations of the scope of the present invention. In summary, the present invention provides a method for programming a memory structure. Through the gate-induced drain leakage or band-to-band tunneling effect induced at the adjacent memory cell (i.e., the memory cell 120), sufficient electron and hole pairs can be generated. The electron or the hole of the generated electron and hole pairs is then injected into the charge storage device of the memory cell 110 to program the memory cell 110 by adding the first gate biasing voltage $V_{GB1}$ to the memory cell 110. Compared with the prior art, only a programming voltage with 10V or 15V is needed by the method for programming a memory structure disclosed in the present invention. In addition, the GIDL or BTBT effect only appears on the bit line where the memory cell 110 desired to be programmed locates and will not appear on other bit lines where adjacent memory cells locates, therefore, disturbance immunity for programming data can be improved.

Those skilled in the art will readily observe that numerous modifications and alterations of the device and method may be made while retaining the teachings of the invention.

What is claimed is:

1. A method for programming a memory structure, the memory structure comprising a plurality of memory cells where each memory cell has a substrate, a source located on the substrate, a drain located on the substrate, a charge storage device located between the source and the drain, and a gate located on the charge storage device and between the source and the drain, the plurality of memory cells comprising a first memory cell and a second memory cell located on an identical bit line (BL) adjacent to the first memory cell, the method comprising:

providing a first gate biasing voltage and a second gate biasing voltage to the gates of the first memory cell and the second memory cell, respectively;

boosting an absolute value of a channel voltage of the first memory cell to generate electron and hole pairs at the drain of the second memory cell through gate-induced drain leakage or band-to-band tunneling, wherein the first gate biasing voltage is greater than the channel voltage of the first memory cell, and the channel voltage of the first memory cell is greater than the second gate biasing voltage; and injecting the electron of the generated electron and hole pairs into the charge storage device of the first memory cell to program the first memory cell;

wherein the substrate is a P-type substrate.

2. The method of claim 1, wherein the plurality of memory cells further comprises a third memory cell located on the bit line, the first memory cell is located between the second memory cell and the third memory cell, and the step of boosting the absolute value of the channel voltage of the first memory cell comprises:

providing a third gate biasing voltage to the third memory cell for boosting an absolute value of a channel voltage of the third memory cell to increase the absolute value of the channel voltage of the first memory cell, wherein the first gate biasing voltage is greater than the third gate biasing voltage.

3. The method of claim 2, wherein the first memory cell, the second memory cell, and the third memory cell are located at adjacent word lines (WL).

4. The method of claim 2, wherein the plurality of memory cells further comprises a fourth memory cell located on the bit line, the second memory cell is located between the first memory cell and the fourth memory cell, and the method further comprises:

providing a fourth gate biasing voltage to the fourth memory cell for boosting an absolute value of a channel voltage of the fourth memory cell to turn off the second memory cell, wherein the first gate biasing voltage is greater than the fourth gate biasing voltage.

5. The method of claim 1, wherein the bit line further comprises two transistors respectively located at a beginning terminal and an end terminal of the bit line, and the method further comprises:

turning off the two transistors.

6. The method of claim 1, wherein the plurality of memory cells further comprises a fourth memory cell located on the bit line, the second memory cell is located between the first memory cell and the fourth memory cell, and the method further comprises:

providing a fourth gate biasing voltage to the fourth memory cell for boosting an absolute value of a channel voltage of the fourth memory cell to turn off the second memory cell, wherein the first gate biasing voltage is greater than the fourth gate biasing voltage.

7. The method of claim 6, wherein the first memory cell, the second memory cell, and the fourth memory cell are located at adjacent word lines.

8. The method of claim 1, wherein the charge storage device is a floating gate device or a charge trapping layer device.

9. The method of claim 1, wherein each memory cell is capable of storing at least one bit.

10. The method of claim 1, wherein the source and the drain of each memory cell are N-type, and an N-type concentration of the source and the drain closer to the substrate is greater than that closer to the charge storage device.

11. The method of claim 1, wherein the memory structure is a non-volatile memory.

12. The method of claim 11, wherein the memory structure comprises a NAND flash, a multiple-time programmable memory (MTP), or a one-time programmable memory (OTP).

* * * * *